(12) United States Patent
Yang

(10) Patent No.: US 11,502,070 B2
(45) Date of Patent: Nov. 15, 2022

(54) ELECTRONIC MODULE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/933,974

(22) Filed: Jul. 20, 2020

(65) Prior Publication Data

US 2022/0020737 A1 Jan. 20, 2022

(51) Int. Cl.
*H01L 25/18* (2006.01)
*H01L 23/367* (2006.01)
*H01L 23/467* (2006.01)

(52) U.S. Cl.
CPC ............ *H01L 25/18* (2013.01); *H01L 23/367* (2013.01); *H01L 23/467* (2013.01)

(58) Field of Classification Search
None
See application file for complete search history.

(56) References Cited

U.S. PATENT DOCUMENTS 8,081,474 B1 * 12/2011 Zohni ................. H01L 23/367
361/708
2008/0135999 A1 * 6/2008 Yang .................. H01L 25/0655
257/E23.18

* cited by examiner

*Primary Examiner* — Michelle Mandala
*Assistant Examiner* — Jordan M Klein
(74) *Attorney, Agent, or Firm* — CKC & Partners Co., LLC

(57) ABSTRACT

A electronic module includes a printed circuit board (PCB) substrate, a controller substrate, a controller, a memory device, and a heat spreader. The controller is disposed on the controller substrate. The memory device is disposed on the PCB substrate. The heat spreader is disposed on the controller and the memory device, in which the heat spreader has a first portion on the controller and a second portion on the memory device, and the heat spreader has a first opening between the first portion and the second portion.

20 Claims, 5 Drawing Sheets

ELECTRONIC MODULE

BACKGROUND

Technical Field

The present disclosure relates to an electronic module, and more particularly to a dual in-line memory module (DIMM).

Description of Related Art

A dual in-line memory module (DIMM) includes a series of dynamic random-access memory (DRAM). The series of DRAM is mounted on a printed circuit board (PCB) and designed for use in personal computers, workstations and servers.

However, a controller of the electronic module (e.g., DIMM) may generate high heat and thus affect the performance of the electronic module. Further, a surface temperature of the DRAM is generally lower than a surface temperature of the controller. If a heat plate is configured to decrease the surface temperature of the controller, the heat plate disposed on and in contact with the DRAM would adversely enhance the surface temperature of the DRAM, and thus affect the performance of the electronic module.

SUMMARY

One aspect of the present disclosure is an electronic module.

According to some embodiments of the present disclosure, an electronic module includes a printed circuit board (PCB) substrate, a controller substrate, a controller, a memory device, and a heat spreader. The controller is disposed on the controller substrate. The memory device is disposed on the PCB substrate. The heat spreader is disposed on the controller and the memory device, in which the heat spreader has a first portion on the controller and a second portion on the memory device, and the heat spreader has a first opening between the first portion and the second portion.

In some embodiments, the first portion of the heat spreader is above the second portion of the heat spreader.

In some embodiments, the memory device has a top surface spaced apart from the second portion of the heat spreader.

In some embodiments, the heat spreader further has a third portion above the memory device, the second portion is between the first portion and the third portion, and the heat spreader further has a second opening between the second portion and the third portion.

In some embodiments, the second portion of the heat spreader has an inclined portion.

In some embodiments, an included angle between the inclined portion and a top surface of the second portion of the heat spreader is in a range from 120 degrees to 150 degrees.

In some embodiments, a bottom surface of the second portion of the heat spreader and a bottom surface of the third portion of the heat spreader are substantially at same horizontal level.

In some embodiments, a length of the first portion of the heat spreader is greater than a length of the controller.

In some embodiments, a length of the second portion of the heat spreader is greater than a length of the memory device.

In some embodiments, the electronic module further includes a thermal material between the controller and the first portion of the heat spreader.

Another aspect of the present disclosure is an electronic module.

According to some embodiments of the present disclosure, an electronic module includes a PCB substrate, a memory device, and a heat spreader. The memory device is disposed on the PCB substrate. The heat spreader is disposed on the memory device, in which the heat spreader has a first portion and a second portion adjacent to the first portion, and the heat spreader has an opening between the first portion and the second portion.

In some embodiments, the memory device has a top surface spaced apart from the second portion of the hear spreader.

In some embodiments, the first portion of the hear spreader has an inclined portion.

In some embodiments, an included angle between the inclined portion and a top surface of the first portion of the heat spreader is in a range from 120 degrees to 150 degrees.

In some embodiments, a bottom surface of the first portion of the heat spreader and a bottom surface of the second portion of the heat spreader are substantially at same horizontal level.

In some embodiments, the electronic module further includes a conductive connector between the memory device and the PCB substrate.

In the aforementioned embodiments, since the heat spreader has the first opening between the first portion and the second portion and the first opening is beneficial for the air to flow to the controller, cooling performance of the heat spreader can be improved. As a result, the performance of the electronic module can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
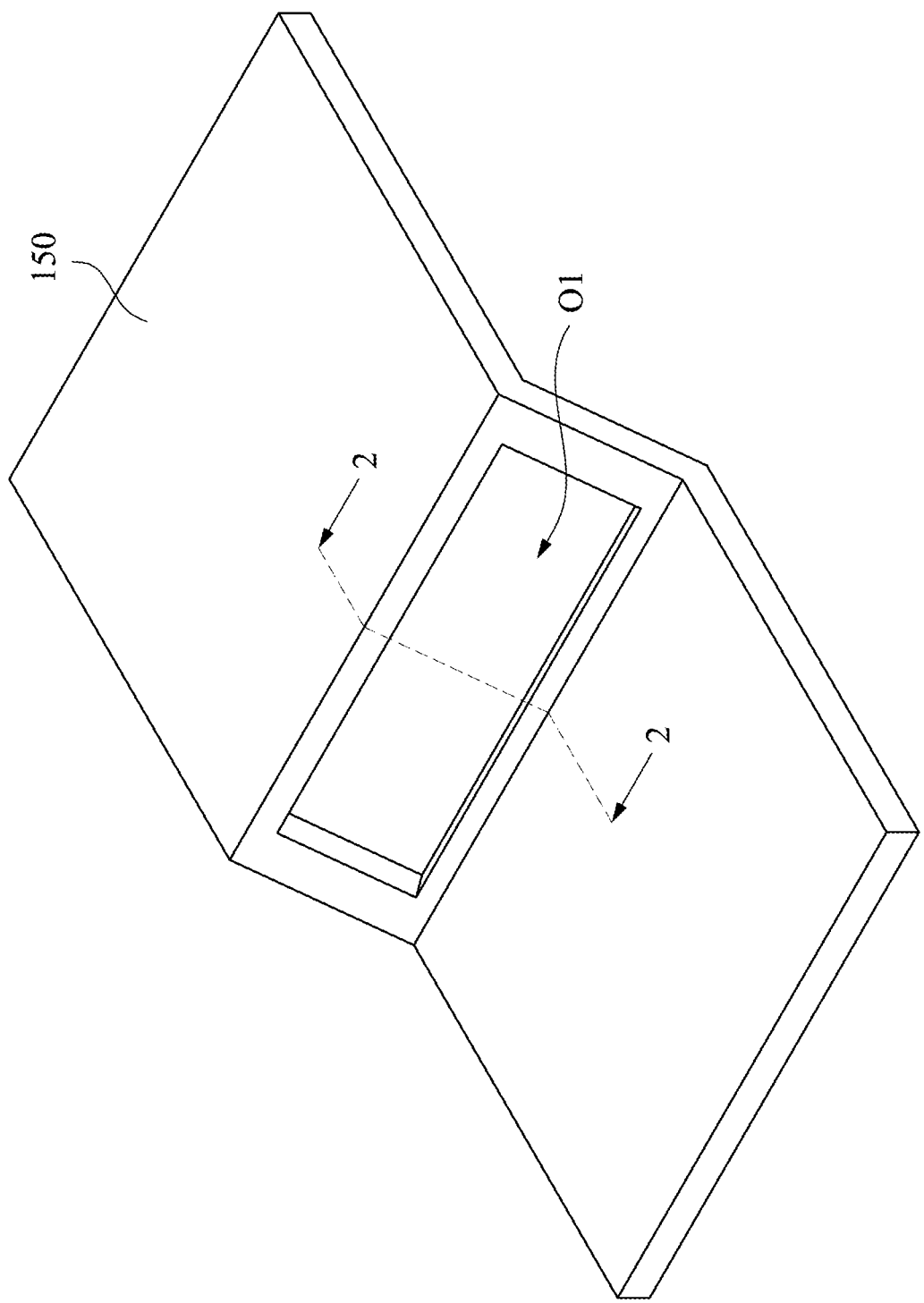
FIG. 1 is a perspective view of a heat spreader in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
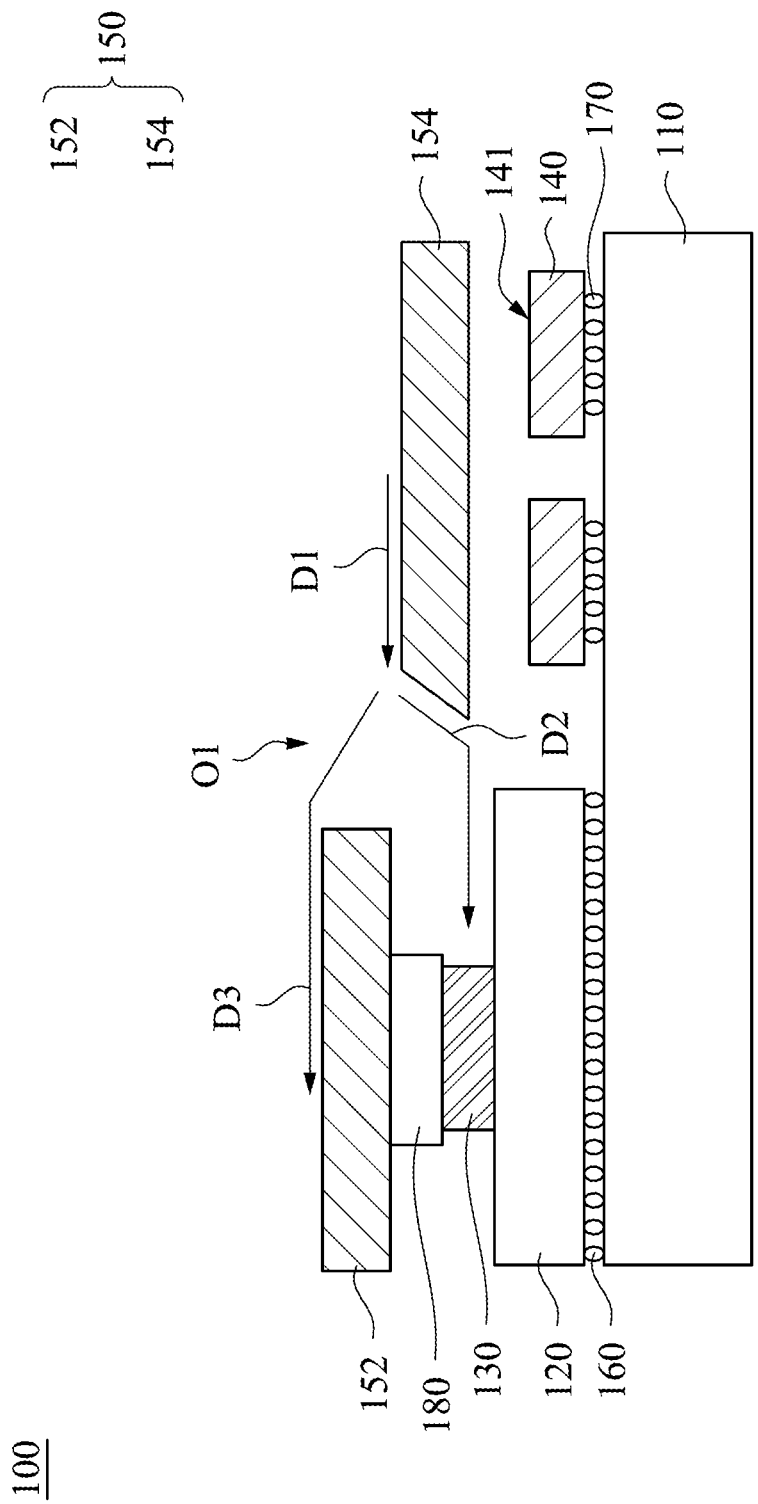
FIG. 2 is a cross-sectional view of the heat spreader taken along line 2-2 of FIG. 1 when being used in an electronic module.

FIG. 1 is a perspective view of a heat spreader 150 in accordance with some embodiments of the present disclosure, and FIG. 2 is a cross-sectional view of the heat spreader 150 taken along line 2-2 of FIG. 1 when being used in an electronic module. Referring to FIG. 1 and FIG. 2, the electronic module 100 includes a printed circuit board (PCB) substrate 110, a controller substrate 120, a controller 130, a memory device 140, and the heat spreader 150. The controller 130 is disposed on the controller substrate 120. The memory device 140 is disposed on the PCB substrate 110. The heat spreader 150 is disposed on the controller 130 and the memory device 140, in which the heat spreader 150 has a first portion 152 on the controller 130 and a second portion 154 on the memory device 140, and the heat spreader 150 has an opening O1 between the first portion 152 and the second portion 154. As a result of such a configuration, the opening O1 is beneficial for the air to flow to the controller 130, thereby improving cooling performance. For example, directions of the air flows adjacent to the heat spreader 150 and the controller 130 are shown by a direction D1, a direction D2, and a direction D3. The air may flow along a top surface of the second portion 154 of the heat spreader 150 in the direction D1, and then pass through the opening O1 of the heat spreader 150 to the controller 130 in the direction D2, and thus the cooling performance can be improved. The air may also flow along a top surface of the first portion 152 of the heat spreader 150 in the direction D3.

In some embodiments, the first portion 152 of the heat spreader 150 is above the second portion 154 of the heat spreader 150. In some embodiments, a top surface of the controller 130 is between a bottom surface of the first portion 152 of the heat spreader 150 and a bottom surface of the second portion 154 of the heat spreader 150.

In some embodiments, the memory device 140 has a top surface 141 spaced apart from the second portion 154 of the heat spreader 150. Further, a surface temperature of the memory device 140 is lower than a surface temperature of the controller 130, and is lower than a surface temperature of the heat spreader 150 as well. Since the memory device 140 is not in contact with the second portion 154 of the heat spreader 150, the adverse effect (e.g., overheat problem) can be avoided. For example, the surface temperature of the memory device 140 is not increased due to the configuration of the heat spreader 150.

In some embodiments, the memory device 140 may include dynamic random access memory (DRAM) dies, static random access memory (SRAM) dies, hybrid memory cube (HMC) modules, or the like. The heat spreader 150 may be made of iron (Fe), or other suitable conductive materials.

In some embodiments, a length of the first portion 152 of the heat spreader 150 is greater than a length of the controller 130. In some embodiments, a length of the second portion 154 of the heat spreader 150 is greater than a length of the memory device 140.

In some embodiments, a conductive connector 160 is disposed between the controller substrate 120 and the PCB substrate 110. In other words, the controller substrate 120 is attached to the PCB substrate 110 with the conductive connector 160. The conductive connector 160 may be formed from a conductive material such as solder, copper, aluminum, gold, nickel, silver, palladium, tin, or other suitable materials. In some embodiments, the conductive connector 160 may be formed by initially forming a layer of solder through methods such as evaporation, electroplating, printing, solder transfer, ball placement, or other suitable method. Once a layer of solder has been formed on the structure, a reflow may be performed in order to shape the conductive connector 160 into desired bump shape. The conductive connector 160 forms joints between the PCB substrate 110 and the controller substrate 120, and electrically connects the PCB substrate 110 and the controller substrate 120.

The memory device 140 is attached to the PCB substrate 110 with a conductive connector 170. In some embodiments, the materials and forming method of the conductive connector 170 are similar to the conductive connector 160.

In some embodiments, a thermal material 180 is disposed between the controller 130 and the first portion 152 of the heat spreader 150. In other words, the thermal material 180 is configured to adhere the controller 130 and the first portion 152 of the heat spreader 150. The thermal material 180 may be made of silicon, carbon, hydrogen, oxygen, a combination thereof, or other suitable materials. For example, the thermal material 180 is formed of alumina ($Al_2O_3$) mixed with silicone.

Figure 3:
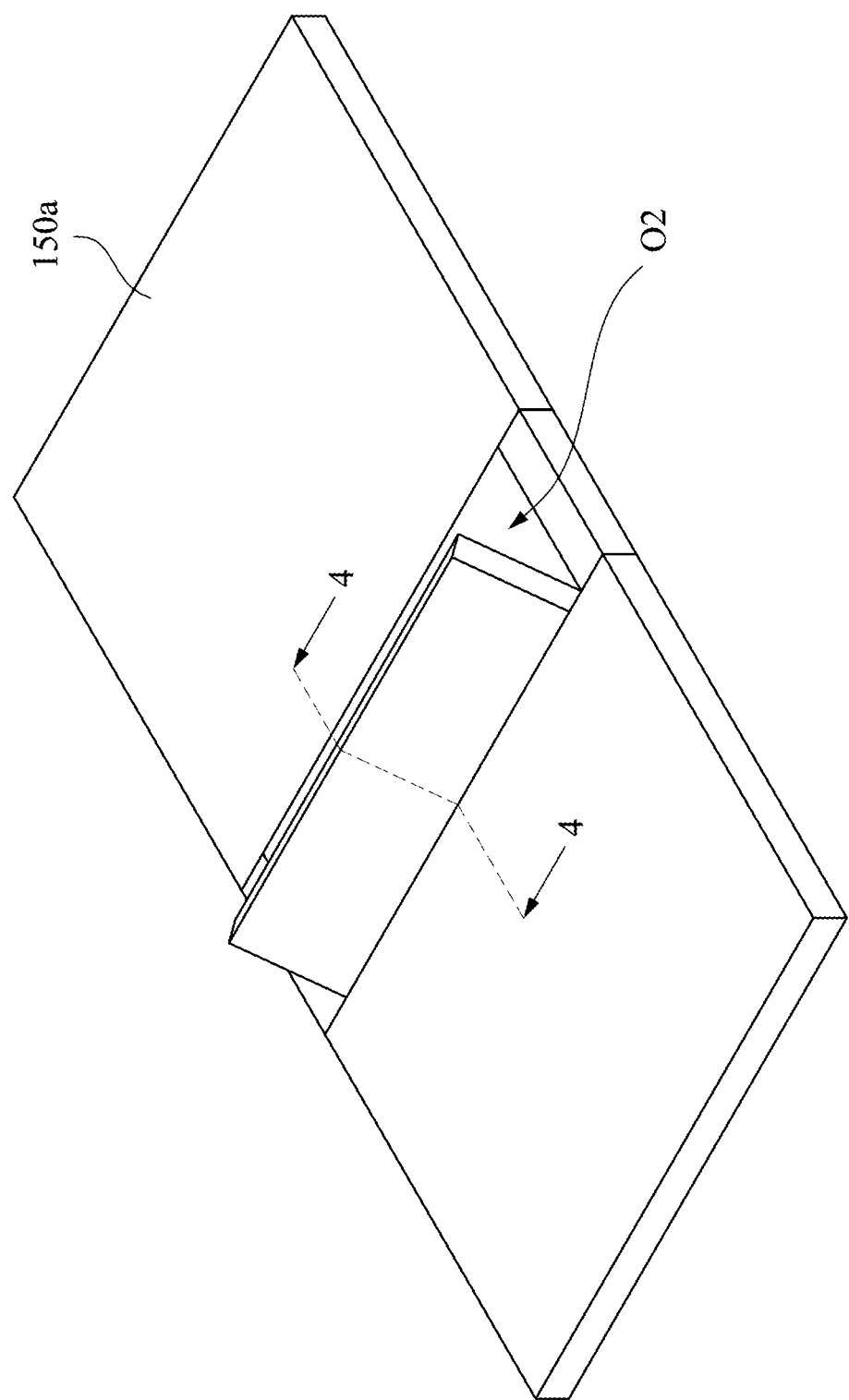
FIG. 3 is a perspective view of a heat spreader in accordance with another embodiment of the present disclosure.
Figure 4:
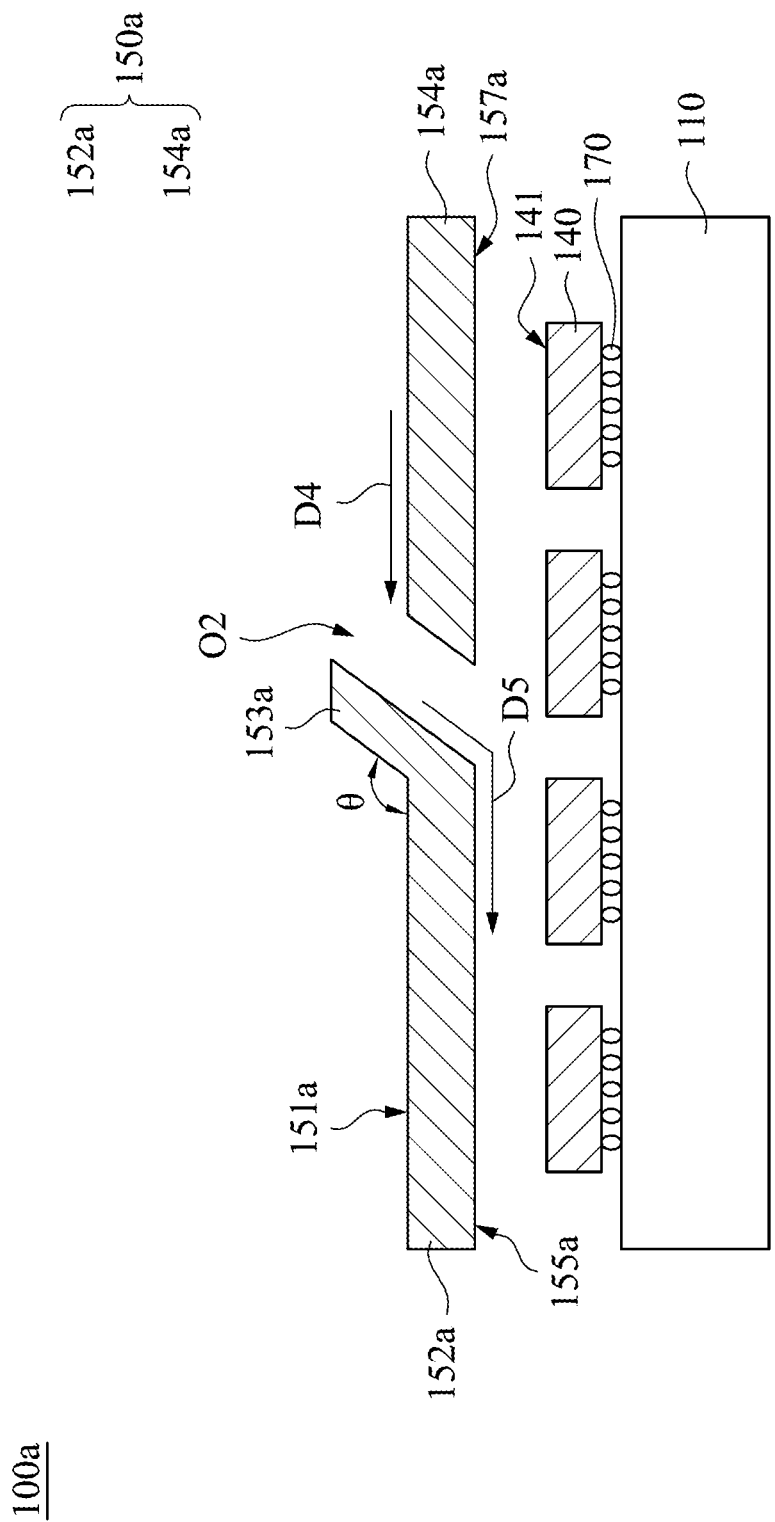
FIG. 4 is a cross-sectional view of the heat spreader taken along line 4-4 of FIG. 3 when being used in an electronic module.

FIG. 3 is a perspective view of a heat spreader 150a in accordance with another embodiment of the present disclosure, and FIG. 4 is a cross-sectional view of the heat spreader 150a taken along line 4-4 of FIG. 3 when being used in an electronic module 100a. Referring to FIG. 3 and FIG. 4, the electronic module 100a includes the PCB substrate 110, the memory device 140, a heat spreader 150a, and the conductive connector 170. The heat spreader 150a in FIGS. 3 and 4 is different from the heat spreader 150 of the electronic module 100 in FIGS. 1 and 2. It is noted that the PCB substrate 110, the memory device 140, and the conductive connector 170 are similar to the embodiment shown in FIGS. 1 and 2, and the description is not repeated herein.

As shown in FIGS. 3 and 4, the memory device 140 is disposed on the PCB substrate 110. The heat spreader 150a is disposed on the memory device 140, in which the heat spreader 150a has a first portion 152a and a second portion 154a adjacent to the first portion 152a, and the heat spreader 150a has an opening O2 between the first portion 152a and the second portion 154a.

In the present embodiments, the memory device 140 has a top surface 141 spaced apart from the second portion 154a of the heat spreader 150a. Since the memory device 140 is not in contact with the second portion 154a of the heat spreader 150a, the adverse effect (e.g., overheat problem) can be avoided. For example, the surface temperature of the memory device 140 would not be increased by the heat spreader 150a. Further, the opening O2 is beneficial for the air to flow to the memory device 140, thereby improving cooling performance. For example, directions of the air flows adjacent to the heat spreader 150a and the memory device 140 are shown by a direction D4 and a direction D5. The air may flow along a top surface of the second portion 154a of the heat spreader 150a in the direction D4, and then flow through the opening O2 of the heat spreader 150a to the memory device 140 in the direction D5, and thus the cooling performance of the heat spreader 150a can be improved.

In some embodiments, as shown in FIG. 4, at least one memory device 140 is disposed on the PCB substrate 110. For example, four memory devices 140 (e.g., four DRAM dies) are disposed on the PCB substrate 110.

In some embodiments, the first portion 152a of the heat spreader 150a further has an inclined portion 153a. The inclined portion 153a extends upward from and directly connects an end of the first portion 152a. For example, the inclined portion 153a is above a top surface 151a of the first portion 152a. In some embodiments, a length of the inclined portion 153a is substantially equal to a distance between the inclined portion 153a and a second portion 154a.

In some embodiments, a top surface of the inclined portion 153a is above a top surface of the second portion 154a. In some embodiments, a bottom surface 155a of the first portion 152a of the heat spreader 150a and a bottom surface 157a of the second portion 154a of the heat spreader 150a are substantially at same horizontal level.

In some embodiments, an included angle θ between the inclined portion 153a and the top surface 151a of the first portion 152a of the heat spreader 150a is larger than about 90 degrees and smaller than about 180 degrees. As such, the air which flows to the memory device 140 can be increased. In some embodiments, the included angle θ between the inclined portion 153a and the top surface 151a of the first portion 152a of the heat spreader 150a is in a range from about 120 degrees to about 150 degrees. For example, the included angle θ is about 135 degrees.

Figure 5:
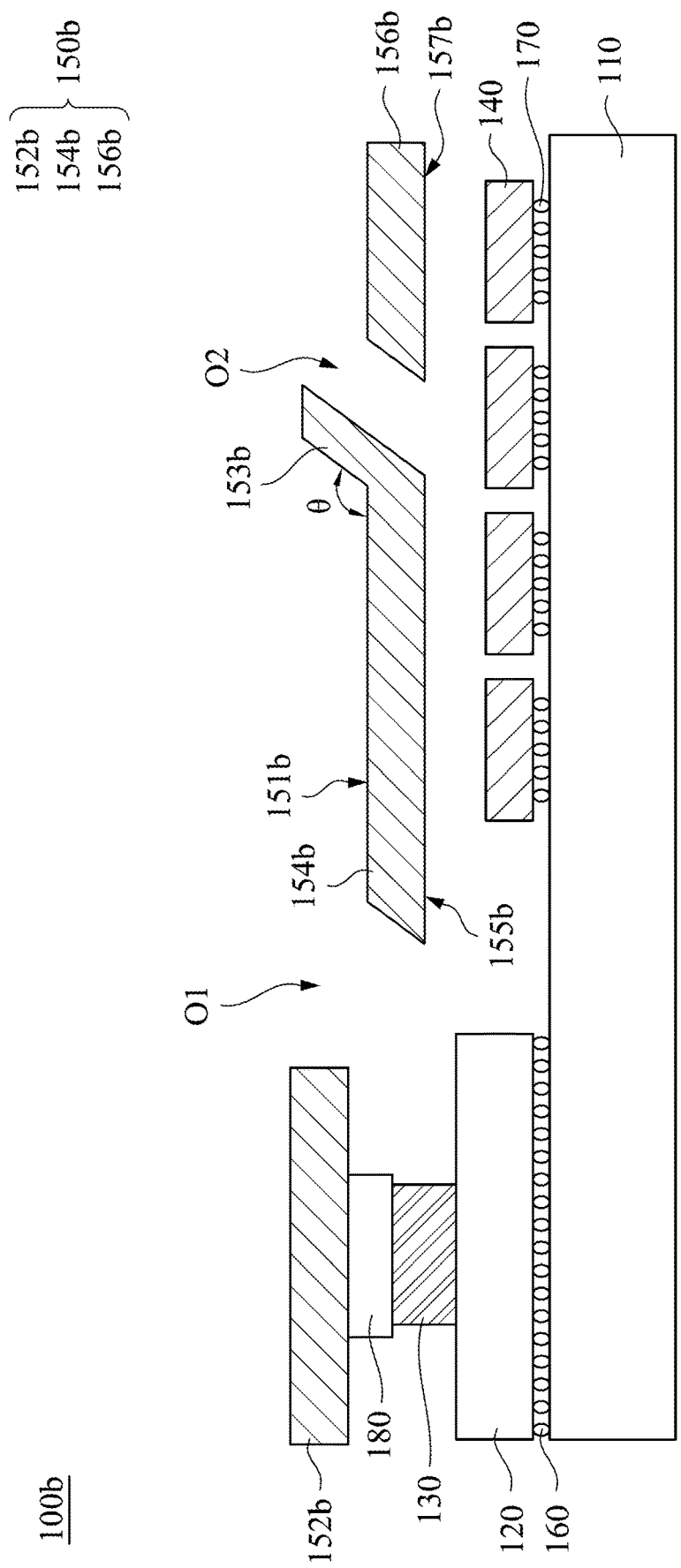
FIG. 5 is a cross-sectional view of a heat spreader when being used in an electronic module in accordance with another embodiment of the present disclosure.

FIG. 5 is a cross-sectional view of a heat spreader 150b when being used in an electronic module 100b in accordance with another embodiment of the present disclosure. Referring to FIG. 5, the electronic module 100b includes the PCB substrate 110, the controller substrate 120, the controller 130, the memory device 140, a heat spreader 150b, the conductive connector 160, and the conductive connector 170. The heat spreader 150b in FIG. 5 is different from the heat spreader 150 of the electronic module 100 in FIGS. 1 and 2. It is noted that the PCB substrate 110, the controller substrate 120, the controller 130, the memory device 140, the conductive connector 160, and the conductive connector 170 are similar to the embodiment shown in FIGS. 1 and 2, and the description is not repeated herein.

In the present embodiments, the heat spreader 150b has a first portion 152b, a second portion 154b, and a third portion 156b, in which the second portion 154b is located between the first portion 152b and the third portion 156b. The heat spreader 150 has a first opening O1 between the first portion 152b and the second portion 154b, and has a second opening O2 between the second portion 154b and the third portion 156b. As such, the first opening O1 is beneficial for the air to flow to the controller 130, and the second opening O2 is beneficial for the air to flow to the memory device 140, thereby improving cooling performance. For example, the air may flow along a top surface of the second portion 154b of the heat spreader 150b, and then pass through the opening O1 of the heat spreader 150b to the controller 130, and thus the cooling performance can be improved.

In some embodiments, the second portion 154b of the heat spreader 150b further has an inclined portion 153b. The inclined portion 153b extends upward from and directly connects an end of the second portion 154b. For example, the inclined portion 153b is above a top surface 151b of the second portion 154b. In some embodiments, a length of the inclined portion 153b is substantially equal to a distance between the inclined portion 153b and a third portion 156b.

In some embodiments, a top surface of the inclined portion 153b is above a top surface of the third portion 156b. In some embodiments, a bottom surface 155b of the second portion 154b of the heat spreader 150b and a bottom surface 157b of the third portion 156b of the heat spreader 150b are substantially at same horizontal level. The top surface of the inclined portion 153b and a top surface of the first portion 152b are substantially at same horizontal level.

In some embodiments, the included angle θ between the inclined portion 153b and the top surface 151b of the second portion 154b of the heat spreader 150b is larger than about 90 degrees and smaller than about 180 degrees. As such, the air which flows to the memory device 140 through the second opening O2 can be increased. In some embodiments, the included angle θ between the inclined portion 153b and the top surface 151b of the second portion 154b of the heat spreader 150a is in a range from about 120 degrees to about 150 degrees. For example, the included angle θ is about 135 degrees.

Based on the aforementioned descriptions, since the heat spreader 150b has the first opening O1 and the opening O2, and the first opening O1 and the opening O2 are beneficial for the air to flow to the controller 130 and the memory device 140, cooling performance of the heat spreader 150b can be improved. As a result, the performance of the electronic module 100b can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electronic module, comprising:
a printed circuit board (PCB) substrate;
a controller substrate on the PCB substrate;
a controller on the controller substrate;
a memory device on the PCB substrate; and
a heat spreader on the controller and the memory device, wherein the heat spreader has a first portion on the controller and a second portion on the memory device, and the heat spreader has a first opening between the first portion and the second portion, wherein the first portion of the heat spreader has a bottom surface that is closer to the PCB substrate than remaining surfaces of the first portion of the heat spreader, the bottom surface of the first portion of the heat spreader is above a top surface of the second portion of the heat spreader adjacent to the first opening, wherein the first portion of the heat spreader has a top surface and a first sidewall connected to and perpendicular to the top surface of the first portion of the heat spreader.

2. The electronic module of claim 1, wherein the memory device has a top surface spaced apart from the second portion of the heat spreader.

3. The electronic module of claim 1, wherein the heat spreader further has a third portion above the memory device, the second portion is between the first portion and the third portion, and the heat spreader further has a second opening between the second portion and the third portion.

4. The electronic module of claim 3, wherein the second portion of the heat spreader has an inclined portion.

5. The electronic module of claim 4, wherein an included angle between the inclined portion and the top surface of the second portion of the heat spreader is in a range from 120 degrees to 150 degrees.

6. The electronic module of claim 3, wherein a bottom surface of the second portion of the heat spreader is coplanar with a bottom surface of the third portion of the heat spreader.

7. The electronic module of claim 1, wherein a length of the first portion of the heat spreader is greater than a length of the controller.

8. The electronic module of claim 1, wherein a length of the second portion of the heat spreader is greater than a length of the memory device.

9. The electronic module of claim 1, further comprising:
a thermal material between the controller and the first portion of the heat spreader.

10. The electronic module of claim 1, wherein the bottom surface of the first portion of the heat spreader is parallel to the top surface of the second portion of the heat spreader.

11. The electronic module of claim 1, wherein the bottom surface of the first portion of the heat spreader is farther from the PCB substrate than the top surface of the second portion of the heat spreader.

12. The electronic module of claim 1, wherein the first portion of the heat spreader has a second sidewall opposite to the first sidewall, the first sidewall of the first portion of the heat spreader and the second sidewall of the first portion of the heat spreader respectively extend upward from the bottom surface of the first portion of the heat spreader, and the first sidewall of the first portion of the heat spreader is parallel to the second sidewall of the first portion of the heat spreader.

13. The electronic module of claim 12, wherein the second portion of the heat spreader has a sidewall connected and extending downward from the top surface of the second portion of the heat spreader, the sidewall of the second portion of the heat spreader is not parallel to the first sidewall of the first portion of the heat spreader, and the first sidewall of the first portion of the heat spreader is closer to the first opening than the second sidewall of the first portion of the heat spreader.

14. An electronic module, comprising:
a printed circuit board (PCB) substrate;
a memory device on the PCB substrate; and
a heat spreader on the memory device, wherein the heat spreader has a first portion, a second portion, and a third portion, the heat spreader has a first opening between the second portion and the third portion, and the first portion of the heat spreader has a bottom surface that is closer to the PCB substrate than remaining surfaces of the first portion of the heat spreader, wherein a vertical distance between the bottom surface of the first portion of the heat spreader and the PCB substrate is greater than a vertical distance between a top surface of the second portion of the heat spreader and the PCB substrate, wherein the second portion of the heat spreader has an inclined portion, and a length of the inclined portion is equal to a distance between the inclined portion and the third portion, wherein a second opening at a sidewall of the memory device furthest from the second portion of the heat spreader is defined between the third portion of the heat spreader and the PCB substrate.

15. The electronic module of claim 14, wherein the memory device has a top surface spaced apart from the second portion or the third portion of the heat spreader.

16. The electronic module of claim 14, wherein an included angle between the inclined portion and a top surface of the second portion of the heat spreader is in a range from 120 degrees to 150 degrees.

17. The electronic module of claim 14, wherein a bottom surface of the second portion of the heat spreader is coplanar with a bottom surface of the third portion of the heat spreader.

18. The electronic module of claim 14, further comprising:
a conductive connector between the memory device and the PCB substrate.

19. The electronic module of claim 14, further comprising:
a controller substrate on the PCB substrate;
a controller on the controller substrate; and
a thermal material between the controller and the first portion of the heat spreader, wherein the bottom surface of the first portion of the heat spreader is in contact with the thermal material, and the top surface of the second portion of the heat spreader is between the bottom surface of the first portion of the heat spreader and a top surface of the controller substrate.

20. The electronic module of claim 19, wherein a vertical distance between the bottom surface of the first portion of the heat spreader and the top surface of the controller substrate is greater than the bottom surface of the second portion of the heat spreader and a top surface of the memory device.

* * * * *